(12) United States Patent
Atkinson et al.

(10) Patent No.: US 8,928,333 B2
(45) Date of Patent: Jan. 6, 2015

(54) CALIBRATION MEASUREMENTS FOR NETWORK ANALYZERS

(75) Inventors: Darren E. Atkinson, La Habra, CA (US); Scott A. Avent, Fountain Valley, CA (US)

(73) Assignee: Raytheon Company, Waltham, MA (US)

( * ) Notice: Subject to any disclaimer, the term of this patent is extended or adjusted under 35 U.S.C. 154(b) by 483 days.

(21) Appl. No.: 13/308,342

(22) Filed: Nov. 30, 2011

(65) Prior Publication Data

US 2013/0134990 A1    May 30, 2013

(51) Int. Cl.
*G01R 35/00*        (2006.01)
(52) U.S. Cl.
CPC .................. *G01R 35/005* (2013.01)
USPC .......................... 324/601; 324/638
(58) Field of Classification Search
USPC ................................. 324/601, 638
See application file for complete search history.

(56) References Cited

U.S. PATENT DOCUMENTS

| | | | |
|---|---|---|---|
| 6,836,743 B1* | 12/2004 | Blackham et al. | 702/107 |
| 7,107,170 B2 | 9/2006 | Jamneala et al. | |
| 2004/0153265 A1* | 8/2004 | Martens et al. | 702/65 |
| 2005/0030047 A1* | 2/2005 | Adamian | 324/650 |
| 2008/0036469 A1* | 2/2008 | Chladek et al. | 324/601 |

\* cited by examiner

*Primary Examiner* — Jeff Natalini
(74) *Attorney, Agent, or Firm* — Christie, Parker & Hale, LLP

(57) ABSTRACT

A method for measuring s-parameters of an N-port device under test (DUT), using an N-port test fixture and a network analyzer. The method includes: measuring calibration errors of the N-port test fixture using a reduced set of N/2 calibration standards; measuring calibration errors due to the network analyzer by calibrating only the network analyzer using analyzer-only calibration standards; isolating test fixture s-parameters errors using results of the analyzer-only calibration standards measurement and the N-port test fixture calibration standard measurement; measuring the s-parameters errors of the DUT; and correcting the s-parameters errors of the DUT corresponding to the isolated test fixture s-parameters errors and the calibration errors of the network analyzer.

6 Claims, 13 Drawing Sheets

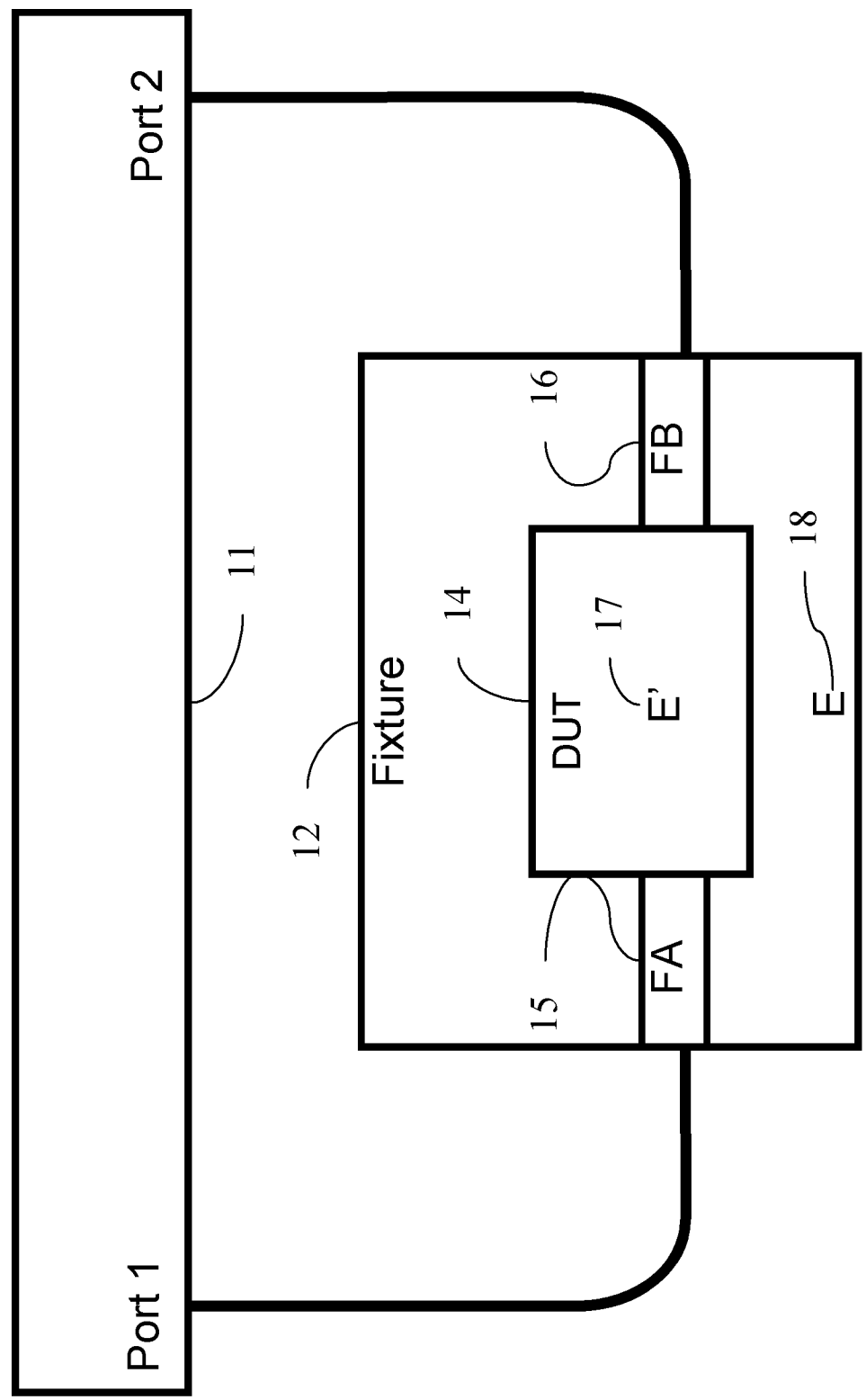

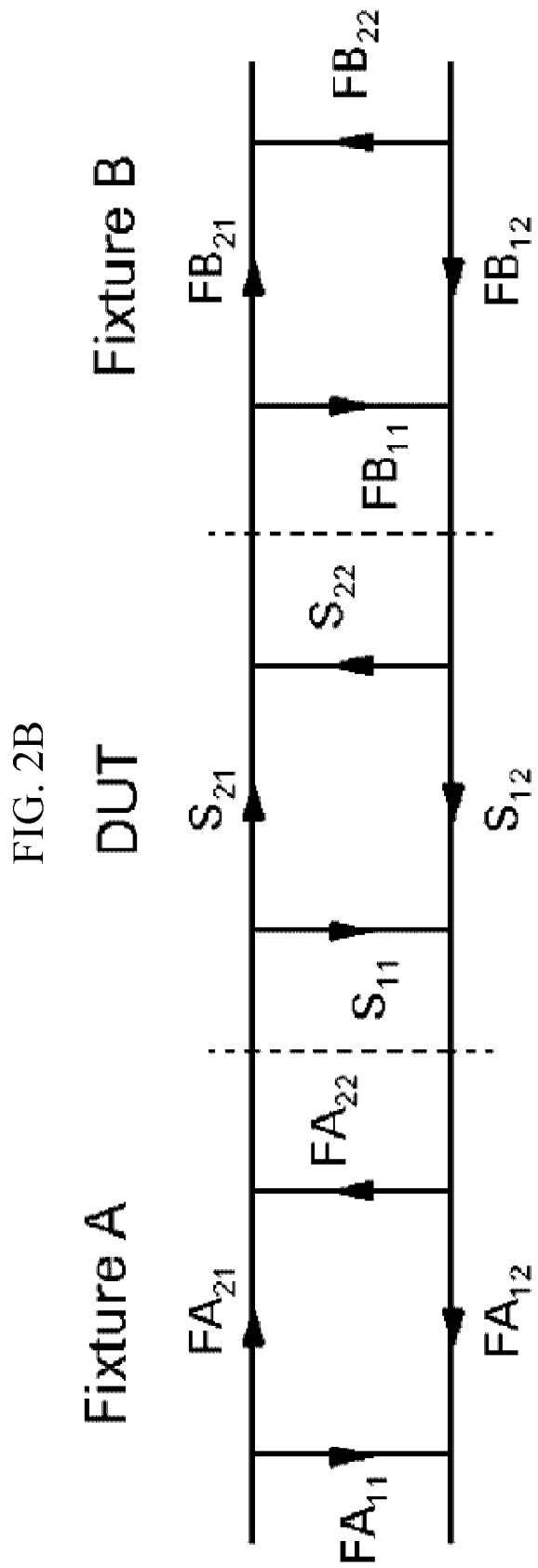

CALIBRATION MEASUREMENTS FOR NETWORK ANALYZERS

STATEMENT REGARDING FEDERALLY SPONSORED RESEARCH

This invention disclosure is related to a government contract. The U.S. Government has certain rights to this invention.

FIELD OF THE INVENTION

The present invention relates generally to electronic test and measurement techniques, and more particularly to a method for combining measurement error terms for a network analyzer to reduce the complexity of calibration standards measurements.

BACKGROUND

A network analyzer measures the network parameters of electrical networks, such as s-parameters. A vector network analyzer measures both amplitude and phase properties, while a scalar network analyzer measures amplitude properties only. However, the precision of the measurements are typically impacted by the noises and errors introduced, for example, as a function of temperature and time, in the support circuitry, such as the test fixture, and the cabling of the network analyzers.

The electrical components in the signal path of fixture and the network analyzer may potentially produced phase, amplitude, and time delay distortions in the signal, and the generated distortion undesirably results in the signal being spread over a broader range of frequencies and time and impacts the accuracy of the measured parameters. As a result, calibrations need to be performed for the measurement "system" which includes both the network analyzer and test fixture to improve the accuracy and repeatability of the analyzer and the measured data.

Calibration of a multiport network analyzer entails measuring s-parameters of a set of specialized devices known as "calibration standards," using the analyzer. A set of error coefficients for an error model of the measurement system is then calculated from the measured s-parameters using known values of the calibration standards. The error coefficients may be used to apply a correction to the "raw" s-parameters generated (measured) by the analyzer for the device under test (DUT). This technique essentially maps the measurement plane of the DUT to the Calibration plane of the network analyzer.

Furthermore, calibrating a multiple (N) channel RF test fixture for accurate s-parameter measurements of a RF DUT is substantially time consuming and cumbersome, since each port needs a calibration to be performed that is time consuming and complicated. Typically, each port requires a separate calibration procedure requiring at least 3 unique calibration standards (depending on calibration routine selected) to be loaded, measured, un-loaded, and stored for future retrieval for measurement reduction to completely and accurately characterize the test fixture.

SUMMARY

Embodiments of the present invention reduces the number of calibration standards and the number of required calibration measurements needed to fully characterize a test fixture for multi-channel RF modules under test. Additionally, using the knowledge that the test fixture, where the N-channel DUT is to be measured, does not electrically change over time, the methods according to the invention eliminate the base fixture recalibration on a daily basis and require a network analyzer-only calibration to capture the network analyzer drift effects on the error terms. Furthermore, the "test fixture only" error terms are completely and accurately determined by two calibrations, one with the standards employed in the test fixture, and one of the analyzer itself, which eliminate the need to perform the typical test fixture modeling for fixture de-embedding, allowing the accurately known test fixture error terms to be manipulated by the invention for accurate n-channel calibration with reduced calibration standards.

In some embodiments, the present invention is a method for measuring s-parameters of an N-port device under test (DUT), using an N-port test fixture and a network analyzer. The method includes: measuring calibration errors of the N-port test fixture using a reduced set of N/2 calibration standards; measuring calibration errors due to the network analyzer by calibrating only the network analyzer using analyzer-only calibration standards; isolating test fixture s-parameters errors using results of the analyzer-only calibration standards measurement and the N-port test fixture calibration standard measurement; measuring the s-parameters errors of the DUT; and correcting the s-parameters errors of the DUT corresponding to the isolated test fixture s-parameters errors and the calibration errors of the network analyzer.

Calibration of interconnecting cables may also be measured and be used in the measured calibration of interconnecting cables in correcting the s-parameters errors of the DUT.

In some embodiments, the present invention is a method for calibrating an N-port test fixture for an N-port device under test (DUT), using a network analyzer. The method includes: measuring calibration errors of the test fixture, using a reduced set of N/2 calibration standards; measuring calibration errors due to the network analyzer only, using analyzer-only calibration standards; measuring calibration errors of a common port of the test fixture; calculating fixture error terms from the measured calibration errors of the test fixture and the measured calibration errors of the network analyzer only; calculating first compounded error terms of the combined test fixture and the network analyzer using fixture error terms with the error terms of a first port of the network analyzer; calculating second compounded error terms of the combined test fixture and the network analyzer using the calibration errors of the common port with the error terms of a second port of the network analyzer; and storing the first and second compounded error terms.

The method may further include measuring s-parameters of the DUT; and using the stored first and second compounded error terms to correct the measured s-parameters of the DUT.

BRIEF DESCRIPTION OF THE DRAWINGS

FIG. 1 shows an exemplary block diagram of a measurement environment for a DUT, according to some embodiments of the present invention.

FIGS. 2A-2C show fixture error term and signal flow definitions used for manipulation of the calibration equations, according to some embodiments of the present invention.

DETAIL DESCRIPTION

FIG. 1 shows an exemplary block diagram of a measurement environment for a device under test (DUT), according to some embodiments of the present invention. As shown, a vector network analyzer 11 including two ports is connected to fixture 12. The fixture 12 includes a DUT 14, a reference plane E' (17) for the DUT and another reference plane E (18) for the fixture 12. In this case, port 1 of the analyzer is connected to the forward port of DUT, FA (15) and port 2 of the analyzer is connected to the reverse port of DUT, FB (16), as depicted. Also, in this case, the multiport DUT has non-insertable RF interfaces. This creates challenges to make accurate RF measurements. Typically, correcting "measurement system" errors requires meticulous measurement of several traceable calibration standards, none of which are available for custom non-insertable RF interconnects of the DUT 14.

In some embodiments, the present invention utilizes de-embedding techniques and calibration equations to come up with a unique set of error term equations along with a unique procedure for substituting the various calibration standard measurements into the modified error term equations to completely characterize the measurement system for accurate, calibrated RF device measurements.

Figure 2A:
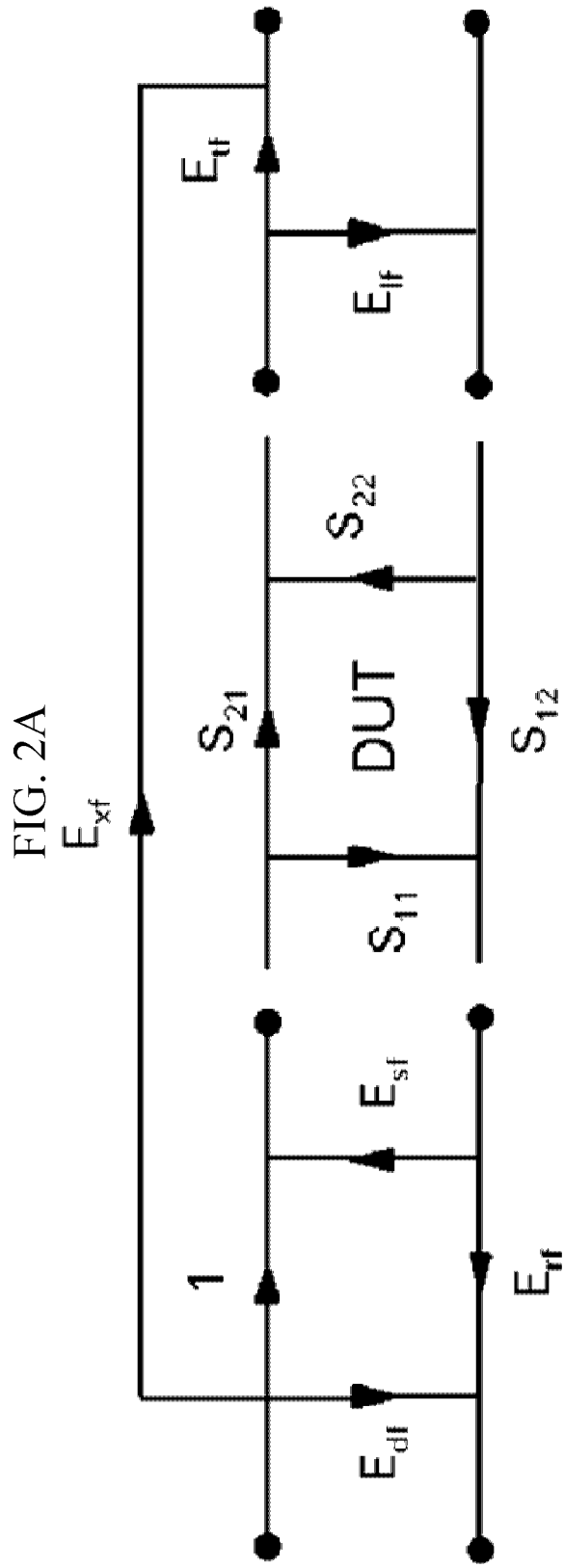
Figure 2C:
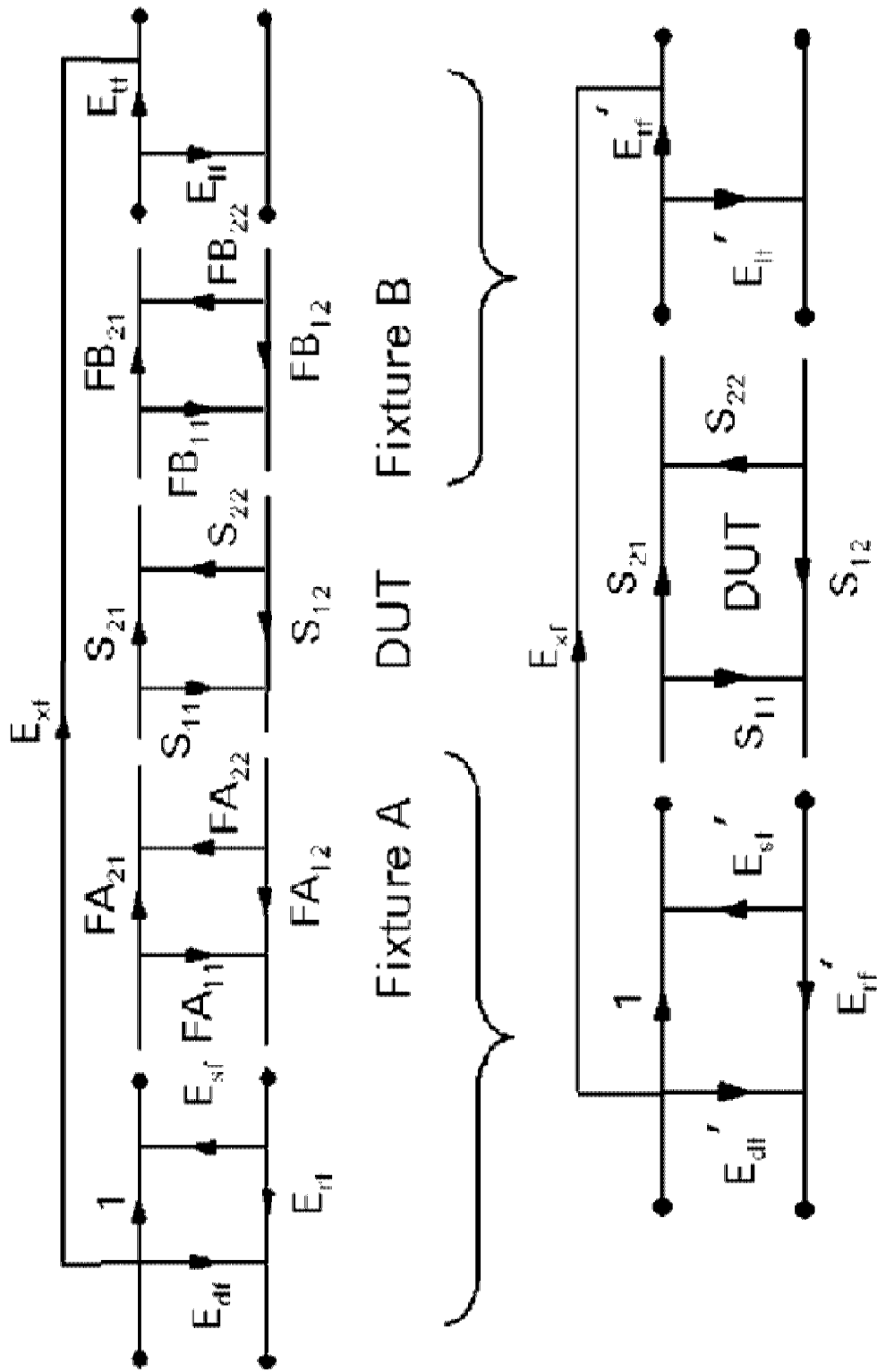

FIGS. 2A-2C show fixture error term and signal flow definitions used for manipulation of the calibration equations, according to some embodiments of the present invention. The error-terms or error coefficients of the error model are represented as vertices in the flow graphs. FIG. 2A is a signal flow graph for the analyzer error terms and the RF cable error terms. The forward two port errors are shown on the graph. FIG. 2B is a signal flow graph for test fixture and the DUT. The graph represents both the test fixture halves and the DUT. The two ports of the test fixture are referred to as "Fixture A," and "Fixture B." FIG. 2C is a signal flow graph for decomposed test fixture error terms. This figure shows how the error terms of separate parts of a measurement system are measured together with the calibration standards inserted into the test fixture, but may be broken out as individual contributors to the overall error model for the measurement system. These individual contributors can then be manipulated to produce complicated multiport calibrations without actually measuring each ports error terms sequentially and individually. As shown, the test fixture s-parameters are combined with the forward two-port error terms.

The combined fixture equations relating the two calibration planes E and E can be presented as follow:

$$\text{FORWARD} \begin{cases} E'_{df} = E_{df} + \dfrac{(E_{rf} FA_{11})}{(1 - E_{sf} FA_{11})} \\ E'_{sf} = FA_{22} + \dfrac{(E_{rf} FA_{12} FA_{21})}{(1 - E_{sf} FA_{11})} \\ E'_{rf} = \dfrac{(E_{rf} FA_{12} FA_{21})}{(1 - E_{sf} FA_{11})^2} \\ E'_{lf} = FB_{11} + \dfrac{(E_{lf} FB_{12} FB_{21})}{(1 - E_{lf} FB_{22})} \\ E'_{tf} = \dfrac{(E_{tf} FA_{21} FB_{21})}{((1 - E_{lf} FB_{22})(1 - E_{sf} FA_{11}))} \\ E'_{xf} = E_{xf} \end{cases} \quad \begin{cases} E'_{dr} = E_{dr} + \dfrac{(E_{rr} FB_{22})}{(1 - E_{sr} FB_{22})} \\ E'_{sr} = FB_{11} + \dfrac{(E_{sr} FB_{12} FB_{21})}{(1 - E_{sr} FB_{22})} \\ E'_{rr} = \dfrac{(E_{rr} FB_{12} FB_{21})}{(1 - E_{sf} FB_{22})^2} \\ E'_{lr} = FA_{22} + \dfrac{(E_{lr} FA_{12} FA_{21})}{(1 - E_{lr} FA_{11})} \\ E'_{tr} = \dfrac{E_{tr} FA_{12} FB_{12}}{((1 - E_{lr} FA_{11})(1 - E_{sr} FB_{22}))} \\ E'_{xr} = E_{xr} \end{cases} \text{REVERSE} \quad (1)$$

$E_{df}$ = Forward (Port 1) Directivity
$E_{sf}$ = Forward (Port 1) Source Match
$E_{rf}$ = Forward (Port 1) Reflection Tracking
$E_{xf}$ = Forward (Port 1) Isolation
$E_{lf}$ = Forward (Port 1) Load Match
$E_{tf}$ = Forward (Port 1) Transmission Tracking
$E_{dr}$ = Reverse (Port 2) Directivity
$E_{sr}$ = Reverse (Port 2) Source Match
$E'_r$ = Reverse (Port 2) Reflection Tracking
$E_{xr}$ = Reverse (Port 2) Isolation
$E_{lr}$ = Reverse (Port 2) Load Match
$E_{tr}$ = Reverse (Port 2) Transmission Tracking
$FA_{11}$ = $S11$ Test Fixture $A$ (Left Side)
$FA_{21}$ = $S21$ Test Fixture $A$ (Left Side)
$FA_{12}$ = $S12$ Test Fixture $A$ (Left Side)
$FA_{22}$ = $S22$ Test Fixture $A$ (Left Side)
$FB_{11}$ = $S11$ Test Fixture $B$ (Right Side)
$FB_{21}$ = $S21$ Test Fixture $B$ (Right Side)
$FB_{12}$ = $S12$ Test Fixture $B$ (Right Side)
$FB_{22}$ = $S22$ Test Fixture $B$ (Right Side)

These equations are used to solve for the fixture only error terms by using two separate calibrations, one with the calibration standards employed in the test fixture, and one with an other set of, or possibly the same set of calibration standards employed by analyzer itself to determine the network analyzer plus coaxial cable error terms that were included in the fixture calibration previously. This eliminates the need to perform the typical "test fixture modeling" for fixture error term de-embedding, allowing for the gathering of accurately known measured, test "fixture only" error terms. These error terms, once determined are combined with a network analyzer (daily) calibration by use of the same equations above, after rearranging the error terms to account for the directional effect of the fixture calibration to provide corrected "N" port measurement capability without "fixture" recalibration.

The first set (Forward terms) of modified E' terms include "FA and FB" from the fixture calibration measurements. The second Set (Reverse terms) of E' terms is for the common port in this specific applications, where there is no "B fixture" (FB) interface between the calibrated network analyzer port and the common port to the DUT. Therefore, the FB fixture terms can be set to:

$$FB12 = FB21 = 1, FB11 = FB22 = 0 \quad (2)$$

This provides for the calculation of the compounded error terms without an actual "FB" fixture for the common port, but could include a "B" fixture set of error terms if needed.

Accordingly, the fixture s-parameters derived from the separate fixture "E'" and analyzer "E" 12-term error matrices as described above are represented as:

$$\left. \begin{aligned} FA22 &= E'sf - \frac{EsfE'rf}{Erf}(1 - EsfFA11) \\ FA11 &= \frac{Edf - E'df}{Esf(Edf - E'df)Erf} \\ FA21FA12 &= \frac{E'rf(1 - EsfFA11)^2}{Erf} \end{aligned} \right\} \text{Fixture "A" Equations} \quad (3)$$

These equations are used to determine the A fixture "fixture only" error terms. That is, they calculate the four s-parameters of fixture "A" given two 12-term error matrices "E'" and "E'.

$$\left. \begin{aligned} FB22 &= \frac{Edr - E'dr}{Esr(Edr - E'dr) - Err} \\ FB11 &= E'sr - \frac{EsrE'rr}{Err}(1 - EsrFb22) \\ FB21FB12 &= \frac{E'rr}{Err}(1 - EsrFb22)^2 \end{aligned} \right\} \text{Fixture "B" Equations} \quad (4)$$

These equations are used to determine the B fixture "fixture only" error terms (s-parameters).

Where, [E'] terms are the combined analyzer and fixture calibration terms determined from the first set of calibration measurements with the fixture calibration standards installed, and [E] terms are analyzer-only calibration terms determined from a calibration of the network analyzer with no test fixture connected.

Figure 3A:
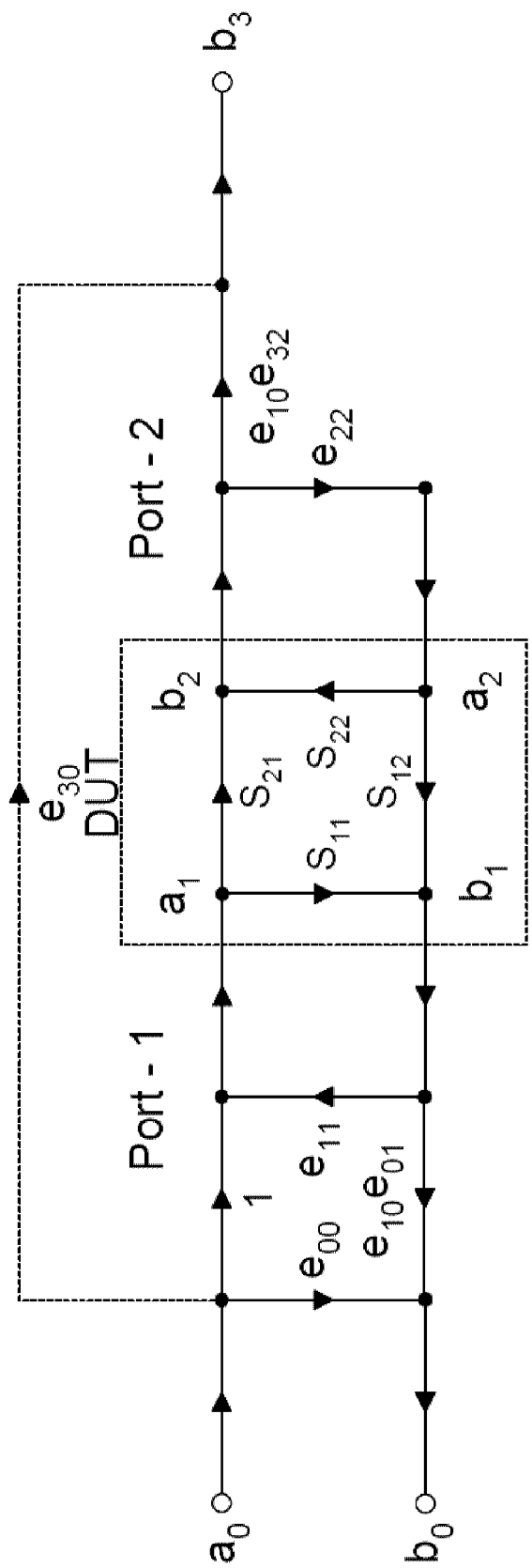
FIGS. 3A-3B show test fixture signal flow graphs, according to some embodiments of the present invention.
Figure 3B:
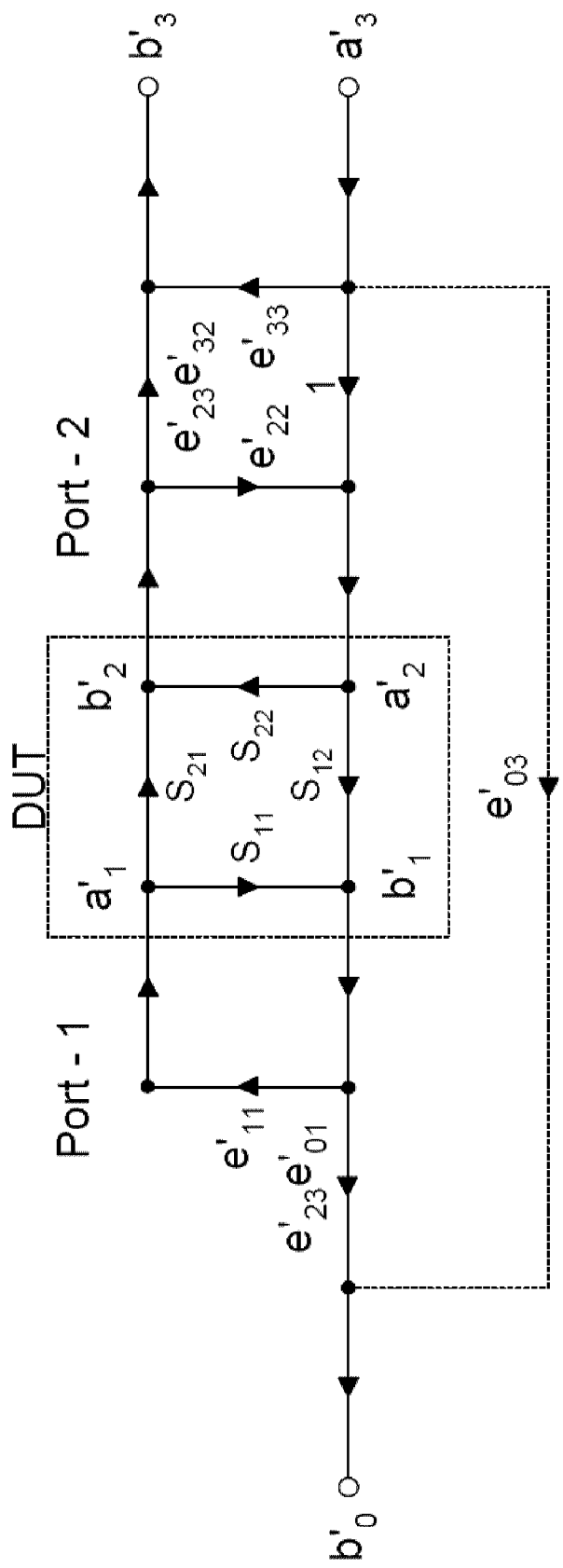

The test fixture signal flow graphs, derived from all possible desired and undesired signal paths for the test fixture and network analyzer, become all of the error paths for signal transmission and reflection and are shown in FIGS. 3A and 3B, respectively. The associated error terms are defined as:

$$\left. \begin{aligned} Edf &= e_{00} = \text{Directivity} \\ Erf &= e_{10}e_{01} = \text{Reflection Tracking} \\ Esf &= e_{11} = \text{Port 1 match} \\ Eef &= e_{22} = \text{Port 2 match} \\ Etf &= e_{10}e_{32} = \text{Transmission Tracking} \\ Exf &= e_{30} = \text{Leakage} \end{aligned} \right\} \text{Forward Error Term Definitions} \quad (5)$$

$$\left. \begin{aligned} Edr &= e_{33} = \text{Directivity} \\ Err &= e_{23}e_{32} = \text{Reflection Tracking} \\ Esr &= e_{22} = \text{Port 2 match} \\ Eer &= e_{11} = \text{Port 1 match} \\ Etr &= e_{23}e_{01} = \text{Transmission Tracking} \\ Exr &= e_{03} = \text{Leakage} \end{aligned} \right\} \text{Reverse Error Term Definitions} \quad (6)$$

Equations (5) and (6) are the standard 12-term error elements named with signal vector labels corresponding to FIGS. 3A and 3B. Error term definitions from the various calibration measurements as defined in FIG. 1 interrelate the measurement planes needed for error correction and are used when converting raw DUT measurements to calibrated DUT measurements are defined below:

$$\begin{array}{lll} \text{Fixture} + Ana & \text{Fixture} + Ana & Ana\ only \\ E'df = e_{00} & E'dr = e'_{33} \Rightarrow & Edr = e_{33} \\ E'rf = e_{10}e_{01} & E'rr = e'_{23}e'_{32} \Rightarrow & Err = e_{23}e_{32} \\ E'sf = e_{11} & E'sr = e'_{22} \Rightarrow & Esr = e_{22} \\ E'ef = e_{22} & E'er = e'_{11} \Rightarrow & Eer = e_{11} \\ E'tf = e_{10}e_{32} & E'tr = e'_{23}e'_{01} \Rightarrow & Etr = e_{23}e_{01} \\ Exf = e_{30} & E'xr = e'_{03} \Rightarrow & Exr = e_{03} \end{array} \quad (7)$$

where, "non-primed" error terms signify "analyzer only" error terms, and "primed" variables signify compounded error terms of the combined fixture and analyzer. These are the error terms used in equation (8) with signal vector labels shown in FIGS. 3A and 3B.

Equations below take uncorrected DUT measured s-parameters and calculate corrected s-parameters using error matrices "F" and "E" measured previously. These equations are derived from the signal flow graphs of the error model and use the 12 term error coefficients derived from the calibration procedures, describe herein after. The equations use the measured error terms of the fixture, cables, and analyzer to de-embed the true measured S-parameters of the DUT from the apparent measured S-parameters of the DUT. This mapping takes place through the equations below.

$$S11 = \frac{\left(\frac{S11m - E'df}{E'rf}\right)\left[1 + \left(\frac{S22m - Edr}{Err}\right)Esr\right] - E'ef\left(\frac{S21m - E'xf}{E'tf}\right)\left(\frac{S12m - Exr}{Etr}\right)}{D} \quad (8)$$

$$S21 = \frac{\left(\frac{S21m - E'xf}{E'tf}\right)\left[1 + \left(\frac{S22m - Edr}{Err}\right)(Esr - E'ef)\right]}{D}$$

$$S22 = \frac{\left(\frac{S22m - Edr}{Err}\right)\left[1 + \left(\frac{S11m - E'df}{E'rf}\right)E'sf\right] - Eer\left(\frac{S21m - E'xf}{E'tf}\right)\left(\frac{S12m - Exr}{Etr}\right)}{D}$$

$$S12 = \frac{\left(\frac{S12m - Exr}{Etr}\right)\left[1 + \left(\frac{S11m - E'df}{E'rf}\right)(E'sf - Eer)\right]}{D}$$

where, the denominator D is:

$$D = \left[1 + \left(\frac{S11m - E'df}{E'rf}\right)E'sf\right]\left[1 + \left(\frac{S22m - Edr}{Err}\right)Esr\right] - \left(\frac{S21m - E'xf}{E'tf}\right)\left(\frac{S12m - Exr}{Etr}\right)E'efEer$$

In other words, the present invention modifies and re-arranges standard de-embedding and calibration equations in a unique way, noting that certain parts of the test fixture do not change over time, to create a set of calibration equations and routines that enable the test fixture or parts of the test fixture to be calibrated separately then recombined to represent a complicated measurement system. This is accomplished with a much reduced set of calibration standards and standard measurements while permitting simple network analyzer only calibrations to be conducted on a more frequent basis to capture analyzer drift errors without a complete system recalibration being needed. This technique provides accurate DUT measurements with a much simpler calibration and saves a lot of calibration time as well. Furthermore, refinement of the equations allows for the fixture error terms to provide a full 1 to N port calibrated measurement system if desired.

Figure 4:
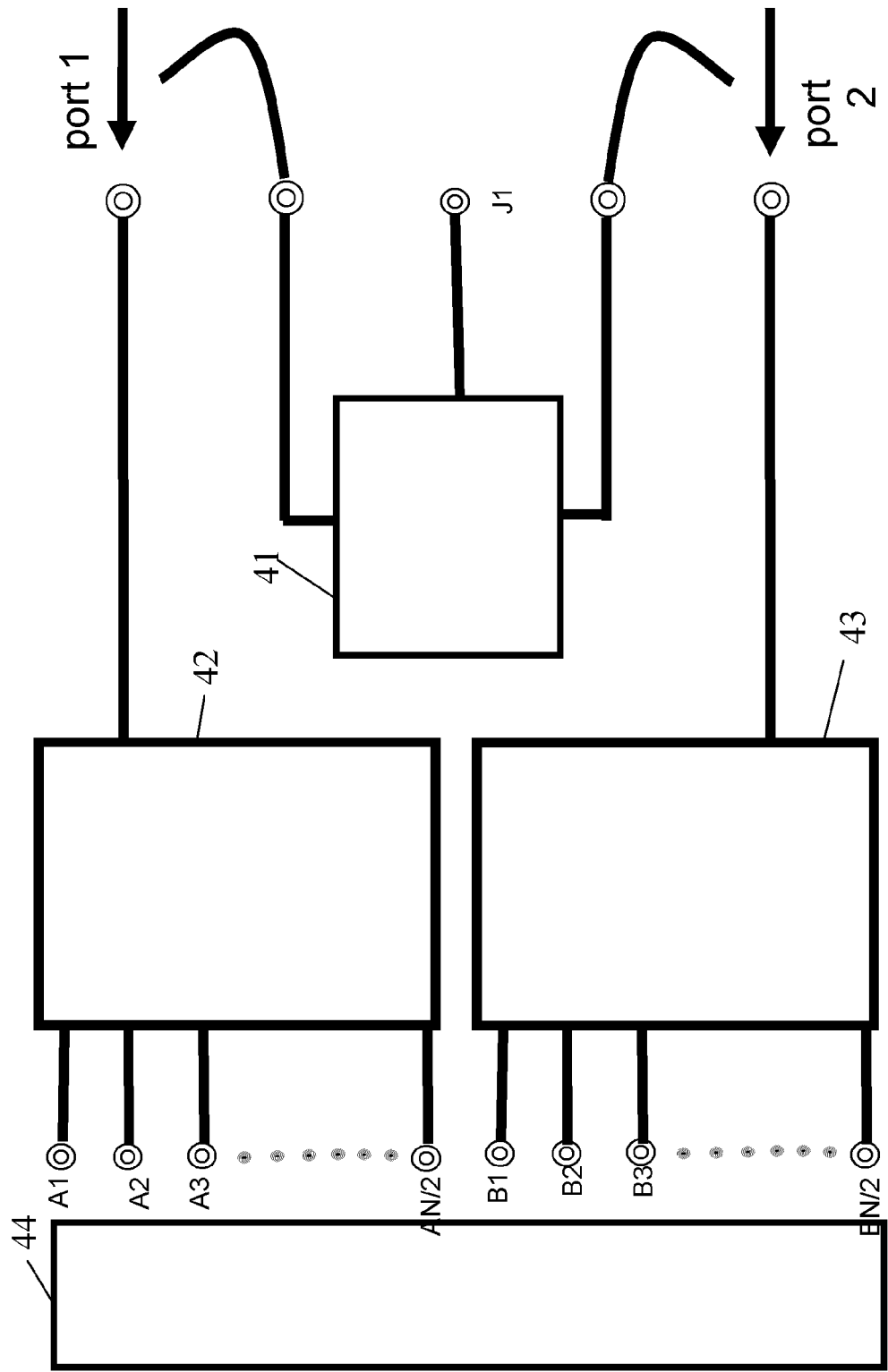
FIG. 4 is an exemplary block diagram for a test fixture calibration configuration, according to some embodiments of the present invention.

FIG. 4 is an exemplary block diagram for a test fixture calibration configuration, according to some embodiments of the present invention. The calibration generates the fixture errors to be stored for future use. This configuration is for performing calibration in the fixture using N/2 set of calibration standards and reading the error terms. Ports 1 and 2 are connected to the network analyzer. Switch 41 is part of the device measurement fixture and is used to select between the "A bank" 42 or the "B bank" 43 during DUT testing only. Calibration module 44 includes the calibration standards for a selected calibration standard. For example, the "through" and "delay" standards in a "Line, Reflect, Line" (LRL) calibration standard have N/2 simultaneous paths connecting An to Bn. The "reflect" standard (for LRL) connects all N ports to a short. All the A signals coupled to the A bank may be bi-directional or uni-directional signals. Similarly, all the B signals coupled to the B bank may also be bi-directional or uni-directional signals.

Figure 5:
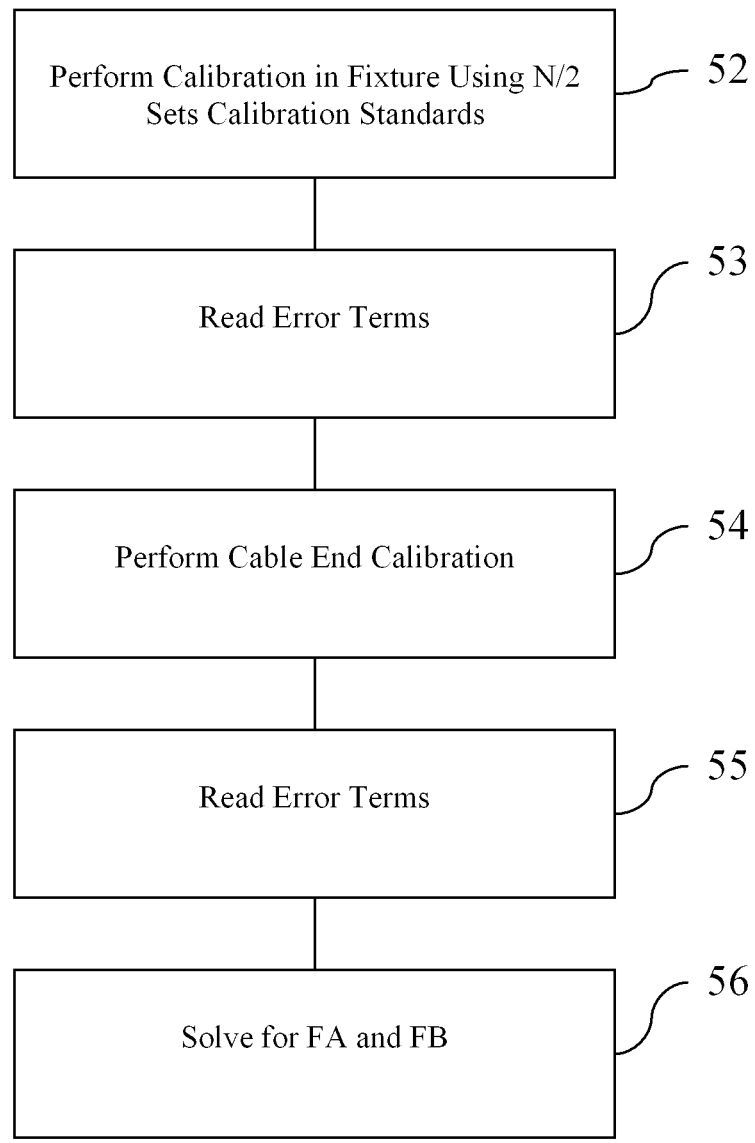
FIG. 5 is an exemplary process flow diagram for a test fixture calibration, according to some embodiments of the present invention.

FIG. 5 is an exemplary process flow diagram for a test fixture calibration, according to some embodiments of the present invention. This process isolates the test fixture errors. After the N-port fixture is connected, calibration, for example, an LRL calibration, is performed in the fixture using, for example, N/2 sets of calibration standards, in block 52. The error terms are read from the network analyzer and are recorded as E', in block 53. A cable end calibration, for example an SOLT calibration, is performed in block 54. The error terms are read form the network analyzer and are recorded as E, in block 55. The E and E error terms using the correct deembedding equations are used to solve for FA and FB error terms (the fixture error terms) and are recorded as F[A1 . . . . AN], and F[B1 . . . BN], in block 56.

Since the fixture in theses embodiments is calibrated with its' own set of calibration standards that utilize the symmetry of the fixture and its' measurement ports, The FB "adapter" error terms must be reversed arithmetically (S11 and S22 parameters exchanged) because, in the calibration configuration for the fixture, the error terms are determined from the reverse set of calibration measurements (during the calibration), which is in the opposite direction for the fixture during DUT measurement. The transmission parameters S21 and S12 are identical since the fixture is reciprocal. If the fixture is electrically stable at the measured RF frequencies, the error data will be stable over time, can be stored for reuse, and can be leveraged with this calibration method to save calibration time. The fixture only part of the calibration may be performed, whenever any fixture components are changed.

Figure 6A:
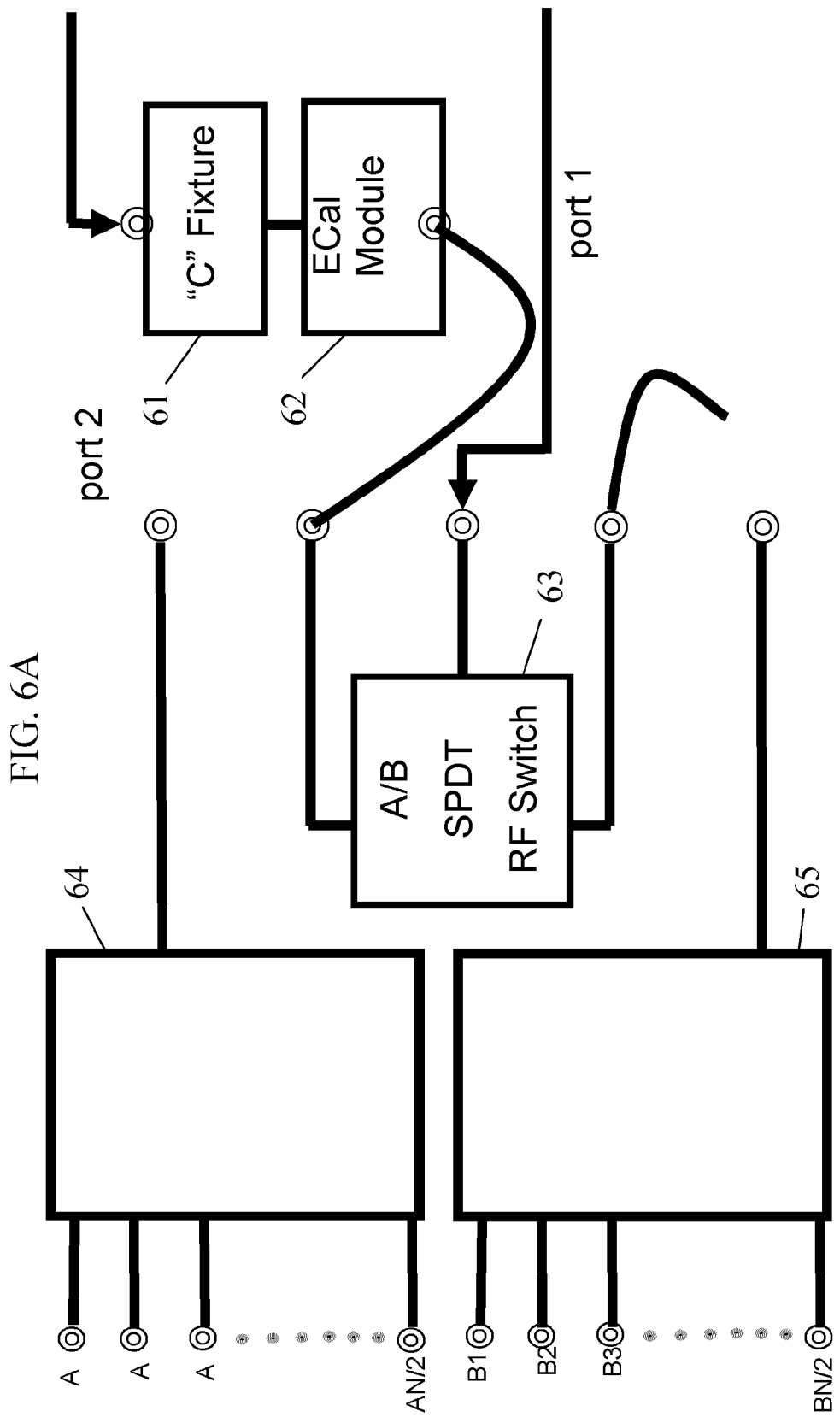
FIGS. 6A and 6B are exemplary process flow diagram for the analyzer's A path and B path calibration, respectively, according to some embodiments of the present invention.
Figure 6B:
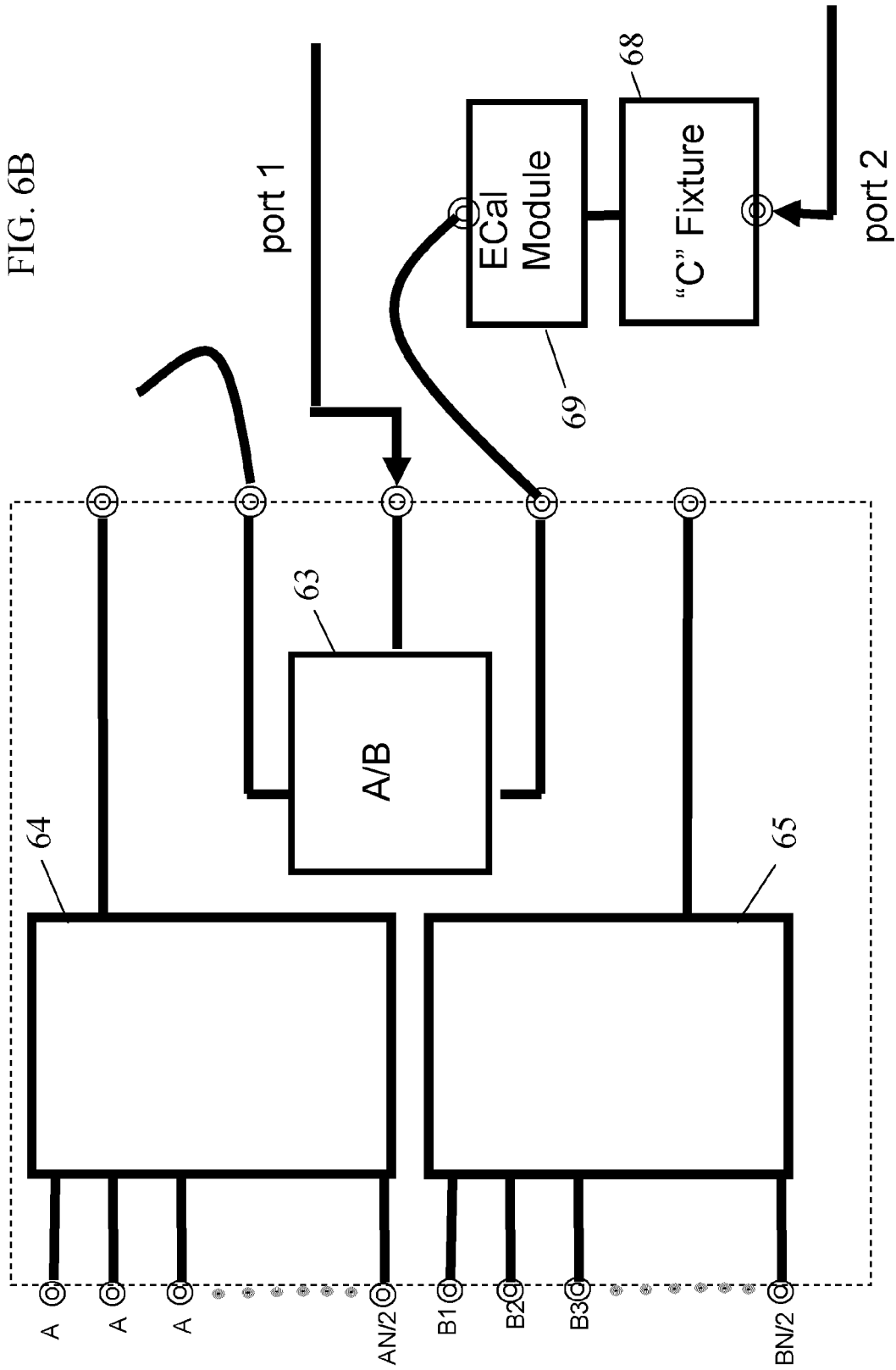

FIGS. 6A and 6B are exemplary block diagrams for calibrating the cabling for the analyzer's A path and B path calibration, respectively, according to some embodiments of the present invention.

As shown in FIG. 6A, the effects of the cable (C fixture) is calibrated by selecting the path through port 1 to the C fixture and to the ports 2. Ports 1 and 2 are connected to the network analyzer. In this case, A path is selecting using switch 63. In some embodiments, calibration module 69 is a commercially available calibration standard for coaxial cable calibration. Similarly, in FIG. 6B, B path is selecting using switch 63.

Figure 7:
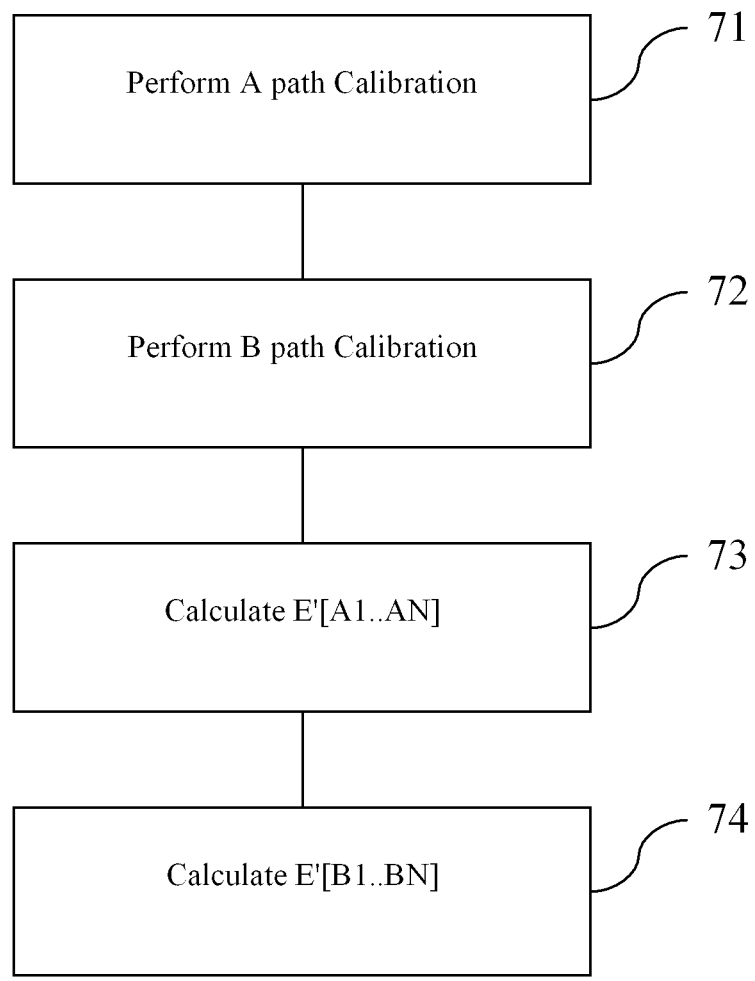
FIG. 7 is an exemplary process flow diagram for the station calibration, according to some embodiments of the present invention.

FIG. 7 is an exemplary process flow diagram for the analyzer calibration, according to some embodiments of the present invention. This process isolates the errors in the network analyzer, cable (if any), etc. After the fixture is connected to the analyzer, A path calibration is performed and the results are stored as E(A), in block 71. Similarly, B path calibration is performed and the results are stored as E(B), in block 72. Optionally, depending on the nature of the DUT, a reference cable may be compensated for C adaptor errors and therefore E(C) is eliminated from calculations.

In block 73, E'[A1 ... AN] is calculated using F[A1 ... AN] obtained from the test fixture calibration, and E(A). Similarly, in block 74, E'[B1 ... BN] is calculated using F[B1 ... BN] obtained from the test fixture calibration, and E(B). Subsequently, all N 2-port calibrations are stored for later uploading to the network analyzer, or for calculating the corrected S-parameters of the DUT by use of the equations (8). The fixture jumpers on DUT fixture are then reconnected.

Figure 8:
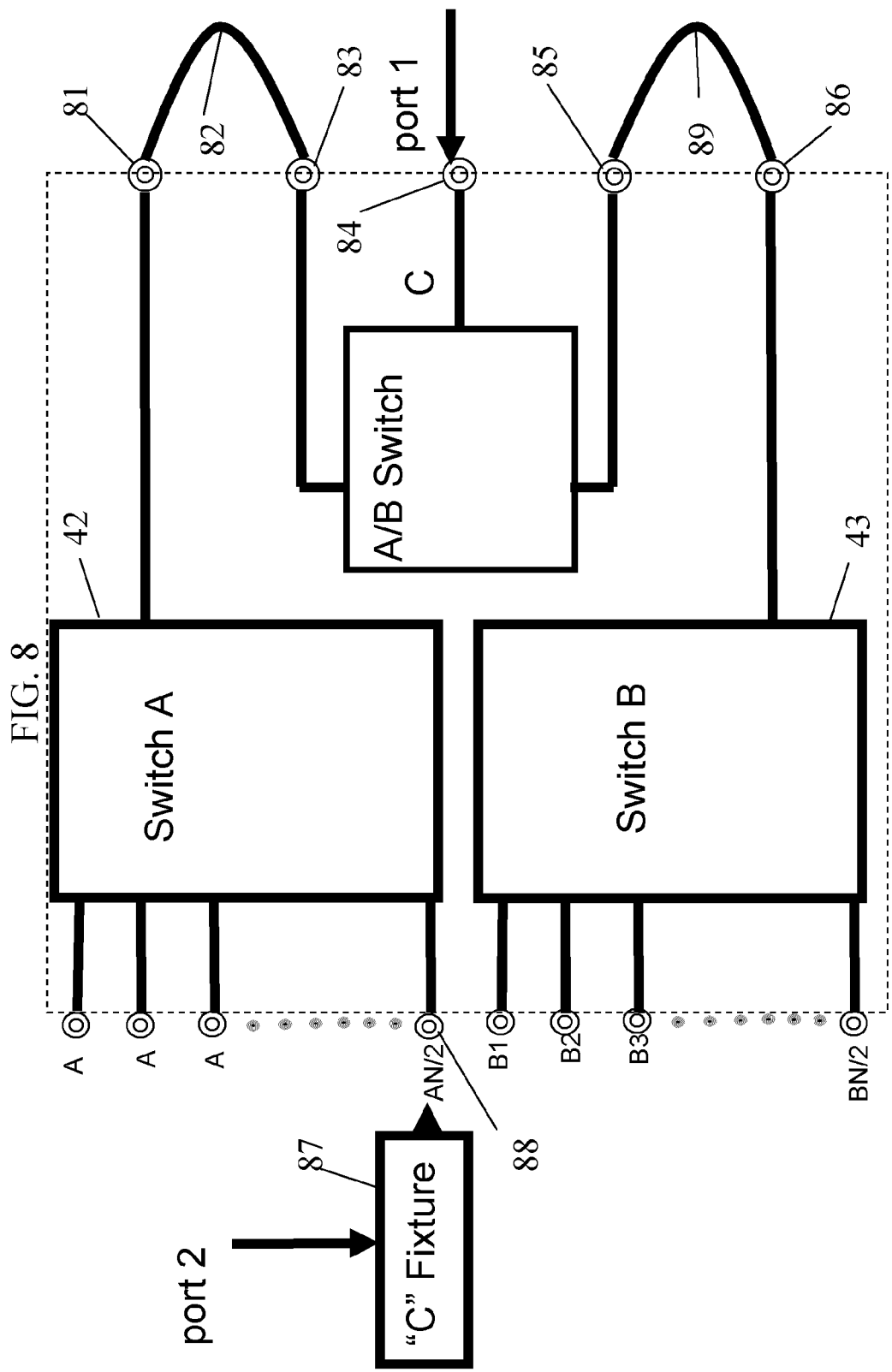
FIG. 8 is an exemplary block diagram for a DUT measurement configuration, according to some embodiments of the present invention.

FIG. 8 is an exemplary block diagram for a DUT measurement configuration, according to some embodiments of the present invention. Again, ports 1 and 2 are connected to the network analyzer. The DUT (not shown) is coupled between the C fixture (cable) and the An and Bn signals 88. Nodes 81 and 83 are shorted using connector 82. Similarly, nodes 85 and 86 are shorted using connector 89. Switch 41 is capable of selecting bank A or bank B.

Figure 9:
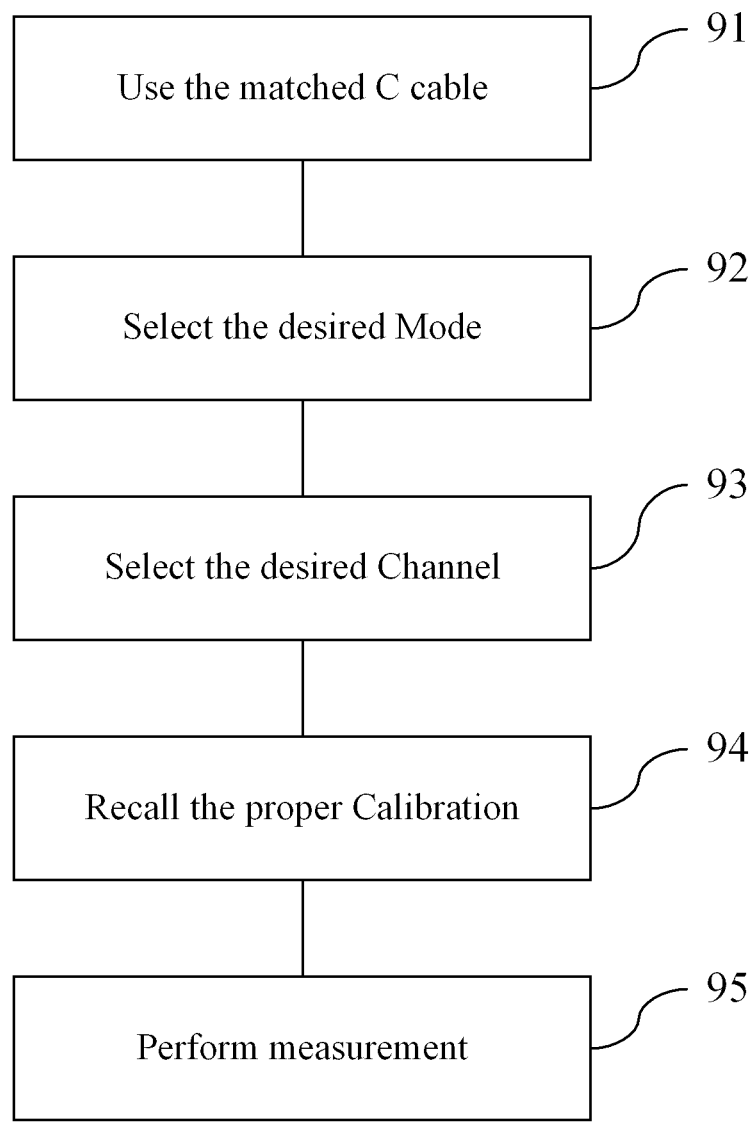
FIG. 9 is an exemplary process flow diagram for the DUT measurement using the correction factors, according to some embodiments of the present invention.

FIG. 9 is an exemplary process flow diagram for the DUT measurement using the correction factors, according to some embodiments of the present invention. This process applies the stored correction (calibration) factors to the measured data. After, the network analyzer is connected to the DUT and the fixture, the matched C cable is used for measurement, in block 91. The cable is optional and is only used for measurement setup due to the connector that is used on the cable. In fact the error terms for the "C" cable could be fully measured and substituted into the FB equations if desired. The desired mode, for example, path A or B is selected in block 92. In block 93, the desired channel, that is, a channel from 1 to N, is selected for the measurement. The proper calibration stored data is then recalled, in block 94, and measurement is performed on the DUT using the selected mode and channel, in block 95, using the configuration according to FIG. 8. This process (blocks 92-95) may be repeated for other modes and channels.

This way, N-port system errors are measured with a simpler configuration that uses a reduced set (N/2) realizable connectorless calibration standards, and then mathematically isolates the fixture errors using an additional network analyzer-only calibration. This technique has a great advantage over the current techniques in which, the test fixture is typically modeled with a simulator or other means with data being fit to the fixture parameters to try and estimate the fixture error terms so they can be eliminated from the rest of the measurement system. The N-port DUT is then measured and the errors are corrected using the isolated fixture errors that are mathematically recombined with a network analyzer measurement of the second common port adapter.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A method for calibrating an N-port test fixture for an N-port device under test (DUT), using a network analyzer, the method comprising:
measuring calibration errors of the test fixture, using a reduced set of N/2 calibration standards;
measuring calibration errors due to the network analyzer only, using analyzer-only calibration standards;
measuring calibration errors of a common input port of the test fixture, which is common to output ports of the test fixture;
calculating fixture error terms from the measured calibration errors of the test fixture and the measured calibration errors of the network analyzer only;
calculating first compounded error terms of a combination of the test fixture and the network analyzer, using the fixture error terms with error terms of a first port of the network analyzer;
calculating second compounded error terms of a combination of the test fixture and the network analyzer, using the calibration errors of the common input port with error terms of a second port of the network analyzer; and
storing the first and second compounded error terms.

2. The method of claim 1, further comprising:
measuring s-parameters errors of the DUT; and
using the stored first and second compounded error terms to correct the measured s-parameters errors of the DUT.

3. The method of claim 2, further comprising measuring calibration of interconnecting cables and using the measured calibration of interconnecting cables in correcting the s-parameters errors of the DUT.

4. The method of claim 2, further comprising selecting the first port of the network analyzer or the second port of the network analyzer for measuring the s-parameters errors of the DUT.

5. The method of claim 2, further comprising using the measured error terms of the fixture, cables, and analyzer to determine true measured s-parameters errors of the DUT from the measured s-parameters errors of the DUT.

6. The method of claim 3, wherein the calibration errors due to the network analyzer and the calibration of interconnecting cables are measured using a Line, Reflect, Line (LRL) calibration standard.

* * * * *